United States Patent
Shimizu et al.

(10) Patent No.: US 8,823,187 B2
(45) Date of Patent: Sep. 2, 2014

(54) SEMICONDUCTOR PACKAGE, SEMICONDUCTOR PACKAGE MANUFACTURING METHOD AND SEMICONDUCTOR DEVICE

(71) Applicant: Shinko Electric Industries Co., Ltd., Nagano-ken (JP)

(72) Inventors: Noriyoshi Shimizu, Nagano (JP); Akio Rokugawa, Nagano (JP); Osamu Inoue, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 8 days.

(21) Appl. No.: 13/667,504

(22) Filed: Nov. 2, 2012

(65) Prior Publication Data
US 2013/0119562 A1    May 16, 2013

(30) Foreign Application Priority Data
Nov. 11, 2011    (JP) .................. 2011-247666

(51) Int. Cl.
| | |
|---|---|
| *H01L 23/29* | (2006.01) |
| *H01L 25/10* | (2006.01) |
| *H01L 23/31* | (2006.01) |
| *H01L 23/498* | (2006.01) |
| *H01L 21/56* | (2006.01) |
| *H01L 23/48* | (2006.01) |
| *H01L 23/538* | (2006.01) |
| *H01L 23/00* | (2006.01) |
| *H01L 25/065* | (2006.01) |
| *H05K 1/18* | (2006.01) |
| *H05K 3/46* | (2006.01) |

(52) U.S. Cl.
CPC ........ *H01L 23/49838* (2013.01); *H01L 25/105* (2013.01); *H01L 23/3128* (2013.01); *H01L 2225/06517* (2013.01); *H01L 24/48* (2013.01); *H01L 23/49827* (2013.01); *H01L 2224/73204* (2013.01); *H01L 2224/32145* (2013.01); *H01L 25/0657* (2013.01); *H01L 2225/1035* (2013.01); *H01L 2224/48091* (2013.01); *H01L 24/32* (2013.01); *H01L 2924/15311* (2013.01); *H01L 2224/16225* (2013.01); *H01L 2224/73265* (2013.01); *H01L 2225/0651* (2013.01); *H01L 2224/04105* (2013.01); *H01L 2224/32225* (2013.01); *H01L 21/563* (2013.01); *H01L 2924/18162* (2013.01); *H01L 23/48* (2013.01); *H01L 2225/06558* (2013.01); *H01L 23/5389* (2013.01); *H05K 1/186* (2013.01); *H01L 2224/16227* (2013.01); *H01L 21/568* (2013.01); *H01L 24/16* (2013.01); *H01L 2224/48227* (2013.01); *H01L 2924/3511* (2013.01); *H01L 24/19* (2013.01); *H01L 2225/1058* (2013.01); *H05K 3/4682* (2013.01)
USPC .................. 257/791; 257/E23.007

(58) Field of Classification Search
CPC .................. H01L 25/0657; H01L 2924/15311
USPC ......... 257/685, 686, 698, 700, 709, 777, 791, 257/E23.007
See application file for complete search history.

(56) References Cited

U.S. PATENT DOCUMENTS

| | | | |
|---|---|---|---|
| 2011/0233735 A1* | 9/2011 | Yoshizawa et al. | ........... 257/620 |
| 2013/0026632 A1* | 1/2013 | Kikuchi et al. | ............... 257/753 |

FOREIGN PATENT DOCUMENTS

JP     2008-300854 A     12/2008

*Primary Examiner* — Quoc Hoang
(74) *Attorney, Agent, or Firm* — Wolf, Greenfield & Sacks, P.C.

(57) ABSTRACT

A semiconductor package includes a semiconductor chip, a first insulating layer formed to cover the semiconductor chip, a wiring structure formed on the first insulating layer. The wiring structure has an alternately layered configuration including wiring layers electrically connected to the semiconductor chip and interlayer insulating layers each located between one of the wiring layers and another. The interlayer insulating layers include an outermost interlayer insulating layer located farthest from a surface of the first insulating layer. A groove formed in the outermost interlayer insulating layer passes through the outermost interlayer insulating layer in a thickness direction.

9 Claims, 12 Drawing Sheets

SEMICONDUCTOR PACKAGE, SEMICONDUCTOR PACKAGE MANUFACTURING METHOD AND SEMICONDUCTOR DEVICE

CROSS-REFERENCE TO RELATED APPLICATIONS

This application is based upon and claims the benefit of priority from prior Japanese Patent Application No. 2011-247666, filed on Nov. 11, 2011, the entire contents of which are incorporated herein by reference.

FIELD

The embodiments discussed herein are related to a semiconductor package, a semiconductor package manufacturing method, and a semiconductor device.

BACKGROUND

A conventional semiconductor package includes a semiconductor chip and a resin layer covering the semiconductor chip. In one example of such semiconductor package, an active surface (i.e., a circuit formation surface) and side surfaces of a semiconductor chip are covered by an insulating layer and a wiring structure electrically connected to the semiconductor chip is stacked on the insulating layer (refer to, for example, Japanese Laid-open Patent Publication No. 2008-300854).

A conventional method of manufacturing a semiconductor package is such that a supporting substrate is prepared and a semiconductor chip is mounted on the supporting substrate in such a manner that a surface of the semiconductor chip on an opposite side of an active surface thereof is placed in contact with a surface of the supporting substrate. Subsequently, the semiconductor chip thus mounted is sealed by an insulating layer and a wiring structure is formed on the insulating layer by laminating wiring layers and interlayer insulating layers. A finished semiconductor package is obtained by finally removing the supporting substrate.

SUMMARY

In a conventional manufacturing process of a semiconductor package, almost no warpage occurs in the semiconductor package just after the semiconductor chip has been fixed onto the supporting substrate and the wiring layer and the wiring structure have been formed, because the supporting substrate has high rigidity. When the supporting substrate is removed, however, stress is released from a portion from where the supporting substrate has been removed, causing a problem that warpage occurs in the semiconductor package as a result of releasing of the stress.

One aspect of the present invention is a semiconductor package including a semiconductor chip, a first insulating layer formed to cover the semiconductor chip, and a wiring structure formed on the first insulating layer, and having an alternately layered configuration including wiring layers electrically connected to the semiconductor chip and interlayer insulating layers each located between one of the wiring layers and another. The interlayer insulating layers include an outermost interlayer insulating layer located farthest from a surface of the first insulating layer. A groove formed in the outermost interlayer insulating layer passes through the outermost interlayer insulating layer in a thickness direction.

Other aspects and advantages of the present invention will become apparent from the following description, taken in conjunction with the accompanying drawings, illustrating by way of example the principles of the invention.

BRIEF DESCRIPTION OF DRAWINGS

The invention, together with objects and advantages thereof, may best be understood by reference to the following description of the presently preferred embodiments together with the accompanying drawings in which.

DESCRIPTION OF EMBODIMENTS

Embodiments will be explained below with reference to accompanying drawings. In the accompanying drawings, featured portion(s) may be enlarged for the convenience of reference and easy understanding of the features and each component is not necessarily illustrated with the same dimensional ratio as an actual dimensional ratio. In the cross sectional views, for easy understanding of a sectional structure of each member, hatching of insulating layers is omitted.

Figure 1A:
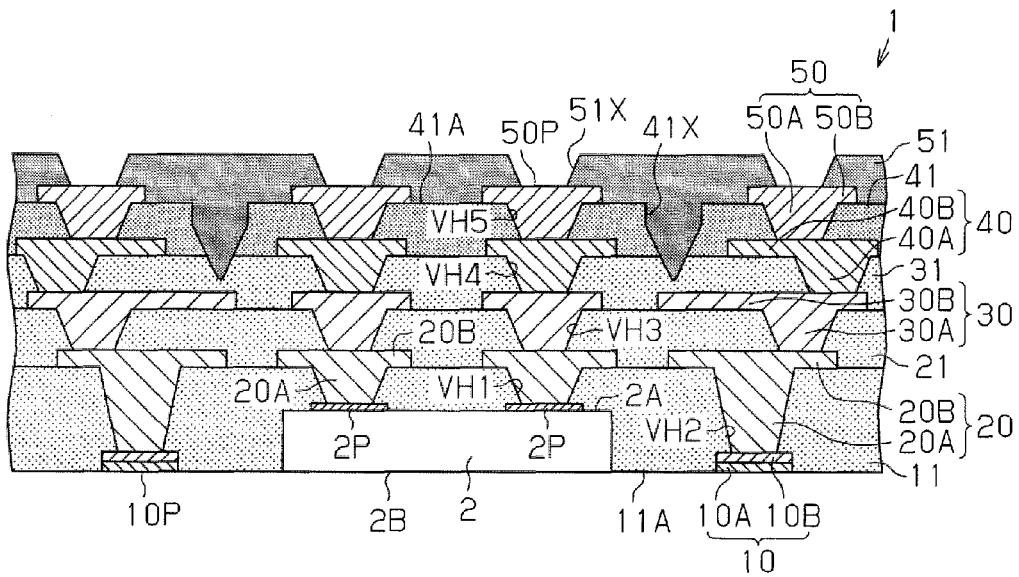
FIG. 1A is a schematic cross-sectional diagram depicting a semiconductor package according to an embodiment of the invention.

A semiconductor package according to an embodiment is described below with reference to FIGS. 1A to 7B. As illustrated in FIG. 1A, the semiconductor package 1 includes a semiconductor chip 2 and a plurality of wiring layers 20, 30, 40 (second, third, and fourth wiring layers 20, 30, 40) which are laminated with interlayer insulating layers 21, 31, 41 (second, third, and fourth insulating layers 21, 31, 41) formed successively. The semiconductor chip 2 may be a logic chip, such as a central processing unit (CPU) or a graphics processing unit (GPU), for example. Alternatively, the semiconductor chip 2 may be a memory chip, such as a dynamic random access memory (DRAM) chip, a static random access memory (SRAM) chip or a flash memory chip, for example.

The semiconductor chip 2 is configured with a semiconductor substrate, for example. The semiconductor substrate may be made of silicon (Si) or the like. A first surface 2A (a top surface as illustrated in FIG. 1A) of the semiconductor chip 2 may be referred to as a circuit formation surface including a semiconductor integrated circuit (not illustrated). Although not illustrated, the semiconductor integrated circuit includes a diffusion layer formed on the semiconductor substrate, an insulating layer laminated on the semiconductor substrate, vias and wirings formed in the insulating layer. On the semiconductor integrated circuit, there are formed electrode pads 2P which are electrically connected to the semiconductor integrated circuit. The electrode pads 2P may be made of aluminum (Al), an alloy of copper (Cu) and Al, an alloy of Cu, Al and Si, or the like.

The semiconductor chip 2 may be as large as approximately 9 mm×9 mm in plan view, for instance. Also, the semiconductor chip 2 may be as thick as approximately 50 to 200 μm, for instance. In the illustrated example, the semiconductor chip 2 is made of silicon and has a thermal expansion coefficient of approximately 3.4 ppm/° C.

The semiconductor package 1 has a wiring structure including a first wiring layer 10, a first insulating layer 11, the second wiring layer 20, the second insulating layer 21, the third wiring layer 30, the third insulating layer 31, the fourth wiring layer 40, the fourth insulating layer 41 and a fifth wiring layer 50 which are successively laminated one on top of another. Unlike a printed wiring board manufactured by the commonly used "buildup" method (in which a specified number of buildup layers are successively formed and laminated on one or both surfaces of a core substrate serving as a supporting base element), the semiconductor package 1 of the illustrated embodiment employs a "coreless configuration" without including any supporting base element.

The second to fifth wiring layers 20, 30, 40, 50 may be made of copper or an alloy of copper, for example.

In the semiconductor package 1, the first wiring layer 10 is formed in an outermost layer (a bottommost layer as illustrated in FIG. 1A). The first wiring layer 10 includes a first conductive layer 10A and a second conductive layer 10B. The first conductive layer 10A may be an electrically conductive layer formed by successively laminating a gold (Au) film and a nickel (Ni) film in this order, the Au film being exposed to the exterior of the semiconductor package 1, for example. The second conductive layer 10B may be an electrically conductive layer made of a Cu layer, for example. The Au film may have a thickness of approximately 0.1 to 1 μm, and the Ni film may have a thickness of approximately 1 to 10 μm, for instance. The second conductive layer 10B (Cu layer) may have a thickness of approximately 10 to 40 μm, for instance.

A first surface (a top surface as illustrated in FIG. 1A) of the first wiring layer 10 and side surfaces thereof are covered by the first insulating layer 11. A second surface (a bottom surface as illustrated in FIG. 1A) of the first wiring layer 10 is exposed from the first insulating layer 11 and functions as connecting pads 10P which is electrically connected to another semiconductor package 4 (refer to FIG. 2), or the like. The first wiring layer 10 may have a flat circular shape having a diameter of approximately 40 to 120 μm, for example. The first wiring layer 10 is formed in an annular area surrounding an outer periphery of the semiconductor chip 2.

The first insulating layer 11 is so formed as to cover the first surface 2A and side surfaces of the semiconductor chip 2 and expose a second surface 2B (a bottom surface as illustrated) of the semiconductor chip 2. Also, the first insulating layer 11 is so formed as to cover the first surface (the top surface as illustrated in FIG. 1A) of the first wiring layer 10 and the side surfaces thereof and expose the second surface (the bottom surface as illustrated in FIG. 1A) of the first wiring layer 10. It follows that a surface 11A (a bottom surface as illustrated in FIG. 1A) of the first insulating layer 11, the second surface 2B of the semiconductor chip 2 and the second surface of the first wiring layer 10 become generally flush with one another. In other words, the semiconductor chip 2 and the first wiring layer 10 (the connecting pads 10P) are formed on the same plane. The first insulating layer 11 may be made of an epoxy insulating resin having a thermosetting property. This epoxy resin has a thermal expansion coefficient of approximately 46 ppm/° C. at temperatures lower than a glass transition temperature Tg (e.g., 150° C.) and approximately 120 ppm/° C. at temperatures equal to or higher than the glass transition temperature Tg. The insulating resin that may be used for forming the first insulating layer 11 is not limited to resin having the thermosetting property but may be an insulating resin having photosensitivity. The first insulating layer 11 may have a thickness of approximately 100 to 180 μm, for instance. In the following discussion, the surface 11A of the first insulating layer 11 may be referred to as the chip mounting surface 11A.

In the first insulating layer 11, there are formed via holes VH1 each passing through the first insulating layer 11 and exposing a top surface of each electrode pad 2P of the semiconductor chip 2. In the first insulating layer 11, there are also formed via holes VH2 each passing through the first insulating layer 11 and exposing the first surface of the first wiring layer 10.

The second wiring layer 20 is formed on top of the first insulating layer 11. The second wiring layer 20 includes via wirings 20A filled in the via holes VH1, VH2 and a wiring pattern 20B formed on the first insulating layer 11. The via wirings 20A are electrically connected to the individual electrode pads 2P which are exposed at the bottom of the via holes VH1 or to the first wiring layer 10 which are exposed at the bottom of the via holes VH2, as well as to the wiring pattern 20B. The via holes VH1, VH2 and the via wirings 20A are individually formed in tapered shapes with diameters thereof increasing from a bottom side (i.e., the side of the connecting pads 10P) to a top side (i.e., the side of the fifth wiring layer 50) as illustrated in FIG. 1A. The via holes VH1, VH2 and the via wirings 20A each has a circular shape in top view, for example. The via holes VH1 and the via wirings 20A formed in the individual via holes VH1 may be approximately 20 to 50 μm in diameter, for example. The via holes VH2 and the via wirings 20A formed in the individual via holes VH2 may be approximately 75 to 150 μm in diameter, for example. Also, the wiring pattern 20B of the second wiring layer 20 may have a thickness of approximately 15 to 35 μm, for example.

The second insulating layer (interlayer insulating layer) 21 is formed on the first insulating layer 11 to cover the second wiring layer 20. The second insulating layer 21 may be made of an insulating resin having the same composition as the first insulating layer 11, for example. The second insulating layer 21 may have a thickness of approximately 15 to 35 μm, for example.

The third wiring layer 30 is formed on the second insulating layer 21. The third wiring layer 30 includes via wirings 30A filled in via holes VH3 each passing through the second insulating layer 21 and exposing a top surface of the second wiring layer 20 as well as a wiring pattern 30B formed on the second insulating layer 21. The via wirings 30A are electrically connected to the second wiring layer 20 which is exposed at the bottom of each via hole VH3 as well as to the wiring pattern 30B. The via holes VH3 and the via wirings 30A are individually formed in tapered shapes with diameters thereof increasing from the bottom side to the top side as illustrated in FIG. 1A. The via holes VH3 and the via wirings 30A each has a circular shape in top view, for example, and each of these elements may be approximately 20 to 50 μm in diameter, for example. The wiring pattern 30B of the third wiring layer 30 may have a thickness of approximately 15 to 35 μm, for example.

The third insulating layer (interlayer insulating layer) 31 is formed on the second insulating layer 21 to cover the third wiring layer 30. The third insulating layer 31 may be made of an insulating resin having the same composition as the first insulating layer 11, for example. The third insulating layer 31 may have a thickness of approximately 15 to 35 μm, for example.

The fourth wiring layer 40 is formed on the third insulating layer 31. The fourth wiring layer 40 includes via wirings 40A filled in via holes VH4 each passing through the third insulating layer 31 and exposing a top surface of the third wiring layer 30 as well as a wiring pattern 40B formed on the third insulating layer 31. The via wirings 40A are electrically connected to the third wiring layer 30 which is exposed at the bottom of each via hole VH4 as well as to the wiring pattern 40B. The via holes VH4 and the via wirings 40A are individually formed in tapered shapes with diameters thereof increasing from the bottom side to the top side as illustrated in FIG. 1A. The via holes VH4 and the via wirings 40A each has a circular shape in top view, for example, and each of these elements may be approximately 20 to 50 μm in diameter, for example. The wiring pattern 40B of the fourth wiring layer 40 may have a thickness of approximately 15 to 35 μm, for example.

The fourth insulating layer 41 is an outermost interlayer insulating layer formed on the third insulating layer 31 to cover the fourth wiring layer 40. In the illustrated embodiment, the fourth insulating layer 41 is the last laminated one of the interlayer insulating layers 21, 31, 41. The fourth insulating layer 41 is an insulating layer containing a reinforcement material which provides the fourth insulating layer 41 with higher mechanical strength (such as rigidity and hardness) than the first to third insulating layers 11, 21, 31. The fourth insulating layer 41 may be made of an insulating resin containing a reinforcement material, the insulating resin being thermosetting resin, for example. The material of the fourth insulating layer 41 may be an insulating resin containing a reinforcement material including a woven fabric or an unwoven fabric made of glass, Aramid fibers or a liquid crystal polymer (LCP) impregnated with epoxy or polyamide thermosetting resin. Preferably, the material of the fourth insulating layer 41 is an insulating resin which has a thermal expansion coefficient closer to the thermal expansion coefficient of the semiconductor chip 2 than to those of the first to third insulating layers 11, 21, 31. In other words, the material of the fourth insulating layer 41 is preferably an insulating resin of which thermal expansion coefficient has been regulated to become lower than those of the first to third insulating layers 11, 21, 31. The thermal expansion coefficient of the fourth insulating layer 41 is set at approximately 18 to 30 ppm/° C., for example. The fourth insulating layer 41 may have a thickness of approximately 50 to 100 μm, for example.

In the third insulating layer 31 and the fourth insulating layer 41, there are formed grooves 41X which penetrate all the way through the fourth insulating layer 41 in a thickness direction thereof. Below a surface 41A of the fourth insulating layer 41, the grooves 41X are each formed down to a depth halfway into the thickness of the third insulating layer 31 which is an insulating layer formed beneath the fourth insulating layer 41. The grooves 41X are formed so as not to interfere with the wiring layers (the fourth wiring layer 40 and the fifth wiring layer 50 in the illustrated embodiment). Each of the grooves 41X is shaped to have a generally wedge-shaped cross section, for example. As illustrated in plan view of FIG. 1B, the grooves 41X are formed to be located in an outside area of the fourth insulating layer 41 located outside an inside area corresponding to an area where the semiconductor chip 2 is mounted. The grooves 41X are arranged in a grid pattern in top view in the outside area, for example.

As illustrated in FIG. 1A, the fifth wiring layer 50 is an outermost wiring layer formed on the fourth insulating layer 41. The fifth wiring layer 50 includes via wirings 50A filled in via holes VH5 each passing through the fourth insulating layer 41 and exposing a top surface of the fourth wiring layer 40 as well as a wiring pattern 50B formed on the fourth insulating layer 41. The via wirings 50A are electrically connected to the fourth wiring layer 40 which is exposed at the bottom of each via hole VH5 as well as to the wiring pattern 50B. The via holes VH5 and the via wirings 50A are individually formed in tapered shapes with diameters thereof increasing from the bottom side to the top side as illustrated in FIG. 1A. The via holes VH5 and the via wirings 50A each has a circular shape in top view, for example, and each of these elements may be approximately 50 to 75 μm in diameter, for example.

Figure 1B:
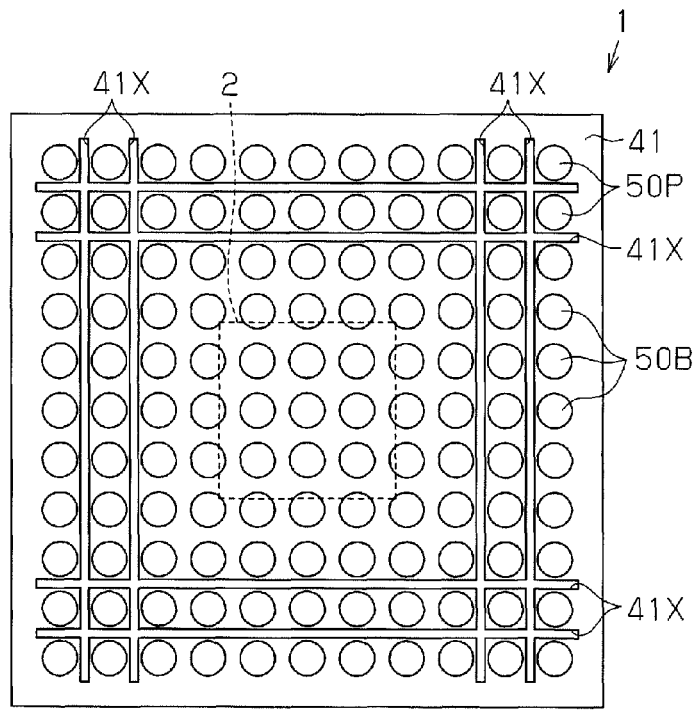
FIG. 1B is a schematic plan view of the semiconductor package according to the embodiment, in which a buried resin layer is not illustrated for the sake of simplicity of illustration.

The wiring pattern 50B of the fifth wiring layer 50 may have a thickness of approximately 15 to 35 μm, for example. As illustrated in FIG. 1B, the wiring pattern 50B are circle-shaped in top view and arranged in a matrix. Thus, the grooves 41X are formed to run along horizontal and vertical directions (as illustrated in FIG. 1B) between adjacent rows or columns of the wiring pattern 50B in the area outside the area where the semiconductor chip 2 is mounted.

On the fourth insulating layer 41 (top side as illustrated in FIG. 1A) which is an outermost layer on an opposite side of a surface 11A where the semiconductor chip 2 is mounted, there is deposited a buried resin layer 51. The buried resin layer 51 is formed to fill the grooves 41X and cover part of the wiring pattern 50B. The buried resin layer 51 may be made of a resin material such as epoxy resin having a thermosetting property in which a filler, such as silica or alumina, is mixed. Preferably, the material of the buried resin layer 51 is an insulating resin of which content of silica or alumina, for instance, has been regulated so that the buried resin layer 51 has a thermal expansion coefficient which is closer to the thermal expansion coefficient of the semiconductor chip 2 than to those of the first to third insulating layers 11, 21, 31. In other words, the material of the buried resin layer 51 is preferably an insulating resin of which thermal expansion coefficient has been regulated to become lower than those of the first to third insulating layers 11, 21, 31. The material of the buried resin layer 51 is preferably an insulating resin which has been regulated to have a glass transition temperature Tg (e.g., approximately 200° C.) which is higher than the glass transition temperatures Tg (e.g., approximately 150° C.) of the first to third insulating layers 11, 21, 31. The thermal expansion coefficient of the buried resin layer 51 is set at approximately 12 ppm/° C. at temperatures lower than the glass transition temperature Tg (200° C. in the illustrated embodiment) and at approximately 40 ppm/° C. at temperatures equal to or higher than the glass transition temperature Tg.

There are formed a plurality of openings 51X in the buried resin layer 51. Parts of the wiring pattern 50B of the fifth wiring layer 50 exposed through the opening 51X constitute a plurality of external connection pads 50P to which a plurality of external connection terminals, such as solder balls and/or leads, used when mounting the semiconductor package 1 on a mother board, for example, are connected. An organic solderability preservative (OSP) process may be performed on areas of the wiring pattern 50B exposed through the openings 51X to form OSP films so that the external connection terminals may be connected to the OSP films when necessary. Alternatively, metallic films may be formed on the areas of the wiring pattern 50B exposed through the openings 51X so that the external connection terminals may be connected to the metallic films. Examples of the metallic films include an Au film, an Ni/Au film (a metallic film formed by depositing an Ni layer and an Au layer in this order), and an Ni/palladium (Pd)/Au film (a metallic film formed by depositing an Ni layer, a Pd layer and an Au layer in this order). The areas of the wiring pattern 50B exposed through the openings 51X themselves (or the OSP films or the metallic films if the OSP films or the metallic films are formed on the wiring pattern 50B) may be used as external connection terminals.

The semiconductor package 1 may have a size approximately equal to 12×12 mm in plan view, for example. The entire semiconductor package 1 may have a thickness approximately equal to 300 to 700 mm, for example.

Figure 2:
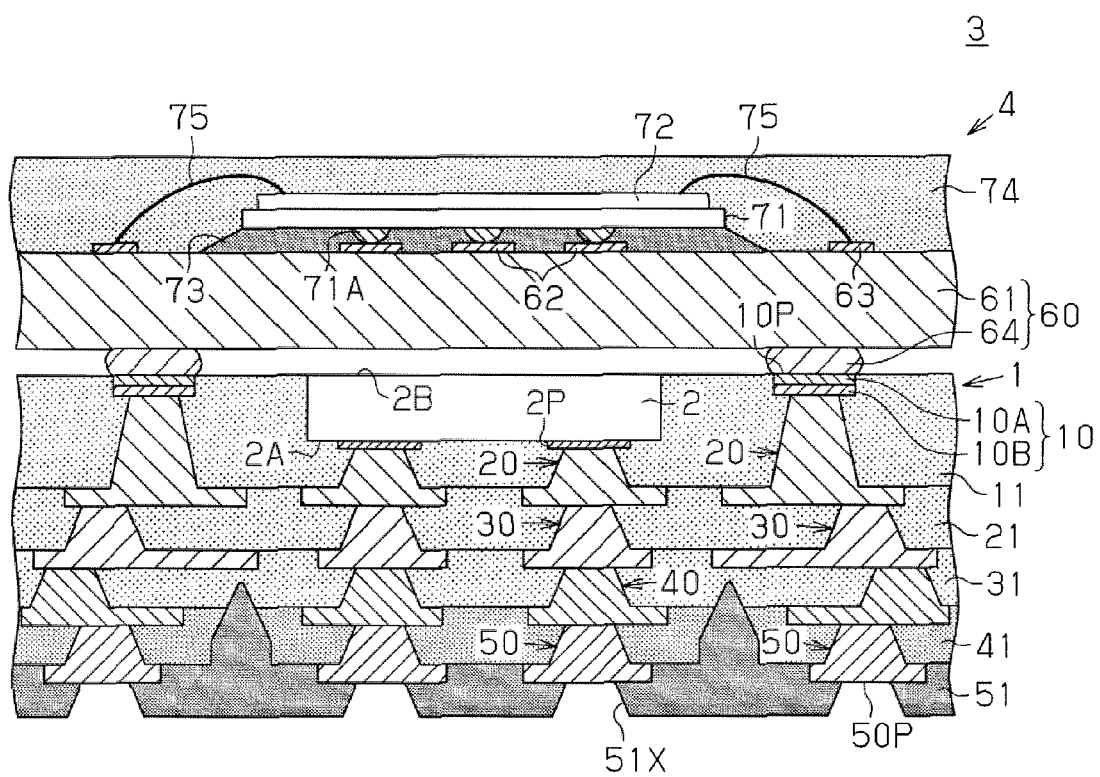
FIG. 2 is a schematic cross-sectional diagram depicting a semiconductor device according to an embodiment of the invention.

Now, the configuration of a semiconductor device 3 is described with reference to FIG. 2, in which the semiconductor package 1 is illustrated upside down as compared to FIG. 1A.

The semiconductor device 3 includes the above-described semiconductor package 1 and another semiconductor package 4 which are laminated together and bonded to each other.

The semiconductor package 4 includes a printed wiring board 60, a first semiconductor chip 71 mounted on the printed wiring board 60 by a flip-chip mounting method and a second semiconductor chip 72 bonded on top of the first semiconductor chip 71. The semiconductor package 4 further includes an underfill resin layer 73 provided to fill a gap between the first semiconductor chip 71 and the printed wiring board 60 and a sealing resin layer 74 for sealing the first semiconductor chip 71 and the second semiconductor chip 72, for example. The first semiconductor chip 71 is made larger than the second semiconductor chip 72 in plan view.

The printed wiring board 60 includes a substrate 61, chip mounting pads 62 and bonding pads 63 formed on a top surface of the substrate 61, and a plurality of external connection terminals 64 formed on a bottom surface of the substrate 61.

Although not illustrated, the substrate 61 is configured to include a plurality of insulating layers as well as vias and wirings formed in the plurality of insulating layers. The vias and the wirings provided in the substrate 61 electrically interconnect the chip mounting pads 62, the bonding pads 63 and the external connection terminals 64. The substrate 61 may be a coreless substrate or a cored buildup substrate having a core substrate, for example.

Bumps 71A of the first semiconductor chip 71 are bonded to the chip mounting pads 62 by flip-chip bonding. The bonding pads 63 are electrically connected to individual electrode pads (not illustrated) formed on a top surface of the second semiconductor chip 72 by means of bonding wires 75. The chip mounting pads 62 and the bonding pads 63 may be made of copper or a copper alloy, for example. The chip mounting pads 62 and the bonding pads 63 may be formed by depositing a metallic film (e.g., an Au film, an Ni/Au film or an Ni/Pd/Au film) on a surface of a copper layer.

The individual external connection terminals 64 are connection terminals (e.g., solder balls or leads) for establishing electrical connections between the semiconductor packages 1 and 4. The plurality of external connection terminals 64 are disposed face to face with the respective connecting pads 10P located on the semiconductor package 1.

The underfill resin layer 73 provided to fill the gap between a top surface of the printed wiring board 60 and a bottom surface of the first semiconductor chip 71 is made of resin which serves to increase bonding strength of bonding portions between the bumps 71A of the first semiconductor chip 71 and the chip mounting pads 62. The underfill resin layer 73 may be made of an epoxy insulating resin, for example.

The sealing resin layer 74 is provided on the top surface of the substrate 61 to seal the first semiconductor chip 71, the second semiconductor chip 72, the bonding wires 75 and the bonding pads 63. The sealing resin layer 74 may be made of an insulating resin such as an epoxy insulating resin, for example. The sealing resin layer 74 may be formed by a transfer molding process, for example.

In this semiconductor device 3, the plurality of external connection terminals 64 formed on a bottom surface of the semiconductor package 4 are individually bonded to the plurality of connecting pads 10P formed on a top surface of the semiconductor package 1. The semiconductor package 1 and the semiconductor package 4 are laminated and bonded together in this fashion, thereby forming the semiconductor device 3 having a package-on-package (POP) structure.

In a conventional semiconductor package, there are not formed any grooves 41X like those of the semiconductor package 1 of the present invention. Described below is warpage that occurs in a semiconductor package in which an insulating layer made of an insulating resin having the same composition as the second insulating layer 21 is formed instead of the fourth insulating layer 41 and the buried resin layer 51. The semiconductor package contracts during a cooling process performed after a heat treatment, for example. The amount of contraction of the semiconductor chip 2 side depends on the thermal expansion coefficient of the semiconductor chip 2, or on the thermal expansion coefficient of silicon. On the other hand, a wiring structure side of the conventional semiconductor package contracts during a cooling process performed after a heat treatment, for example. The amount of this contraction of the wiring structure side depends on the thermal expansion coefficient of the wiring structure side, or on the thermal expansion coefficient of each of the insulating layers like the second insulating layer 21. As mentioned earlier, the thermal expansion coefficient of silicon is 3.4 ppm/° C., whereas the thermal expansion coefficient of the epoxy resin used in the second insulating layer 21 is 46 ppm/° C. at temperatures lower than the glass transition temperature Tg (150° C.) and 120 ppm/° C. at temperatures equal to or higher than the glass transition temperature Tg. From this, it is noted that the thermal expansion coefficient of the wiring structure side of the conventional semiconductor greatly differs from the thermal expansion coefficient of the semiconductor chip 2 side. For this reason, the amount of contraction occurring in the wiring structure side during the cooling process performed after the heat treatment, for example, differs from the amount of contraction occurring in the semiconductor chip 2 side and, therefore, warpage is likely to occur in the semiconductor package 1.

By comparison, the semiconductor package 1 of the illustrated embodiment is configured such that in the fourth insulating layer 41 which is an outermost interlayer insulating layer and the third insulating layer 31 formed in an inner layer of the fourth insulating layer 41, there are formed the grooves 41X passing through the fourth insulating layer 41 in the thickness direction thereof. With this arrangement, the third insulating layer 31 and the fourth insulating layer 41 are each divided into a plurality of segments by the grooves 41X. This makes it possible to alleviate stresses produced by contraction of the third insulating layer 31 and the fourth insulating layer 41 as compared to a case where the third insulating layer 31 and the fourth insulating layer 41 are each formed as a single element without being segmented by the grooves 41X. Thus, the grooves 41X of the embodiment serves to reduce warpage which may occur in the semiconductor package 1.

Additionally, in the semiconductor package 1, the thermal expansion coefficient of the fourth insulating layer 41 which is the outermost interlayer insulating layer and that of the buried resin layer 51 which fills the grooves 41X are made closer to the thermal expansion coefficient of the semiconductor chip 2 than to those of the first to third insulating layers 11, 21, 31. With this arrangement, the thermal expansion coefficient of the buried resin layer 51 side of the semiconductor package 1, or the side of the semiconductor package 1 opposite the semiconductor chip 2, may be made closer to the thermal expansion coefficient of the semiconductor chip 2. Therefore, it is possible to make the amount of contraction occurring on the buried resin layer 51 side during the cooling process performed after the heat treatment, for example, close to the amount of contraction occurring on the semiconductor chip 2 side. This also serves to reduce warpage which may occur in the semiconductor package 1.

A method of manufacturing the semiconductor package 1 is described below.

Figure 3A:
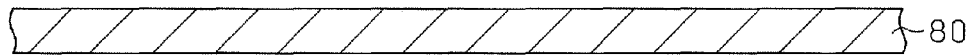
FIGS. 3A to 3E, 4A to 4C, 5A, 5B, 6A and 6B are schematic cross-sectional diagrams depicting a method of manufacturing the semiconductor package according to the embodiment.

When manufacturing the semiconductor package 1, a supporting substrate 80 illustrated in FIG. 3A is prepared in the beginning. For example, a metal sheet or a metal foil may be used as the supporting substrate 80. In this embodiment, the supporting substrate 80 is a copper foil having a thickness of approximately 35 to 200 µm, for example.

Figure 3B:
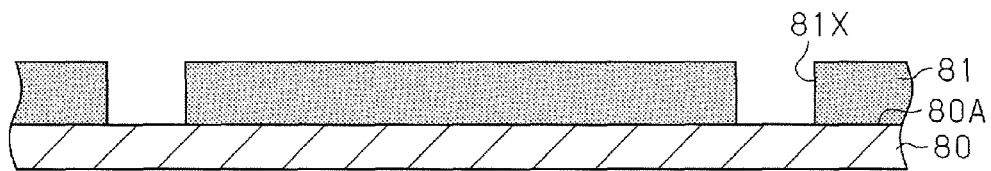

Next, in a process illustrated in FIG. 3B, a resist layer 81 having openings 81X is formed on one surface 80A (a top surface as illustrated) of the supporting substrate 80. The openings 81X are formed to expose areas of the surface 80A of the supporting substrate 80 corresponding to areas of the first wiring layer 10 where the connecting pads 10P are formed (refer to FIG. 1A). The resist layer 81 may be made of photosensitive dry film resist or liquid photoresist (e.g., dry film resist or liquid resist made of novolak resin or acrylic resin). When using the photosensitive dry film resist, for example, a dry film is laminated on the surface 80A of the supporting substrate 80 by thermal compression bonding and the laminated dry film is patterned by exposure and development processes, thereby forming the patterned resist layer 81 having the openings 81X. The resist layer 81 may be formed by similar processes when the liquid resist is used.

Figure 3C:
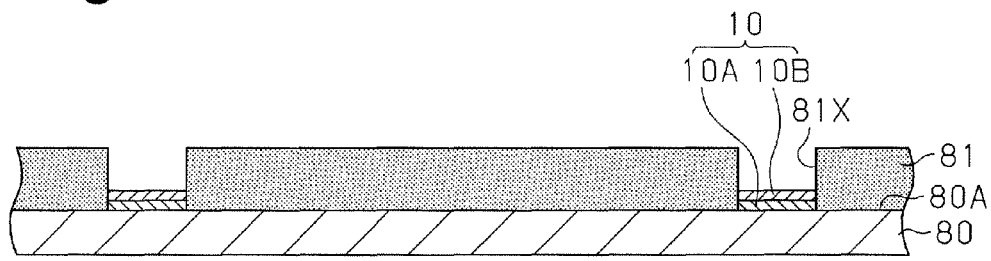

In a succeeding process illustrated in FIG. 3C, the surface 80A of the supporting substrate 80 is subjected to electroplating using the resist layer 81 as a plating mask and the supporting substrate 80 as a seed layer. Portions of the surface 80A of the supporting substrate 80 exposed through the openings 81X of the resist layer 81 are subjected to electroplating to form the first wiring layer 10 by successively depositing the first conductive layer 10A and the second conductive layer 10B on the surface 80A in each of the openings 81X. If the first conductive layer 10A is made of an Au film and an Ni film which are successively deposited in this order and the second conductive layer 10B is made of a Cu film, for example, the Au film and the Ni film are successively deposited by an electroplating method using the supporting substrate 80 as a seed layer to form the first conductive layer 10A at first. Then, the Cu film is deposited on the first conductive layer 10A to form the second conductive layer 10B by the electroplating method using the supporting substrate 80 as a seed layer. Subsequently, the resist layer 81 is removed.

Figure 3D:
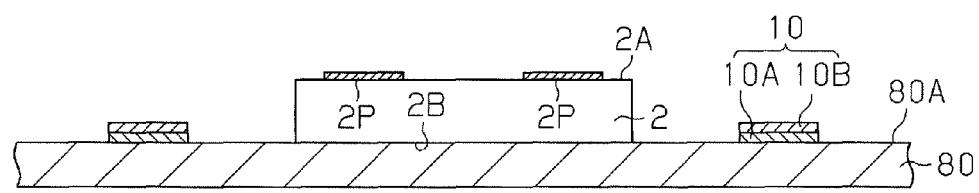

Next, in a process illustrated in FIG. 3D, the semiconductor chip 2 is fixed on the surface 80A of the supporting substrate 80. For example, the semiconductor chip 2 is fixed face up on the surface 80A of the supporting substrate 80 so that the second surface 2B of the semiconductor chip 2 on an opposite side of the first surface 2A thereof faces the surface 80A of the supporting substrate 80. For example, an adhesive layer (not illustrated) is formed on the second surface 2B of the semiconductor chip 2 in advance and the semiconductor chip 2 placed face up on the surface 80A of the supporting substrate 80 is pressed against the surface 80A so that the semiconductor chip 2 is fixed on the surface 80A of the supporting substrate 80 via the adhesive layer.

Figure 3E:
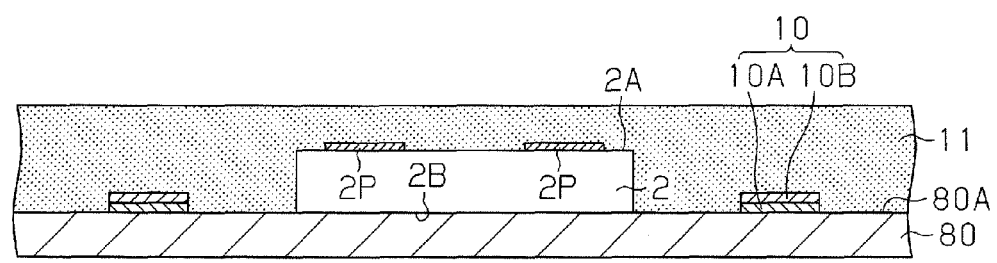

Subsequently, in a process illustrated in FIG. 3E, the first insulating layer 11 is formed on the surface 80A of the supporting substrate 80 so as to cover the semiconductor chip 2 and the first wiring layer 10. The first insulating layer 11 may be formed by laminating a resin film on the supporting substrate 80 and then hardening the resin film by a heat treatment performed at a temperature of approximately 130 to 150° C. while pressing the resin film.

Figure 4A:
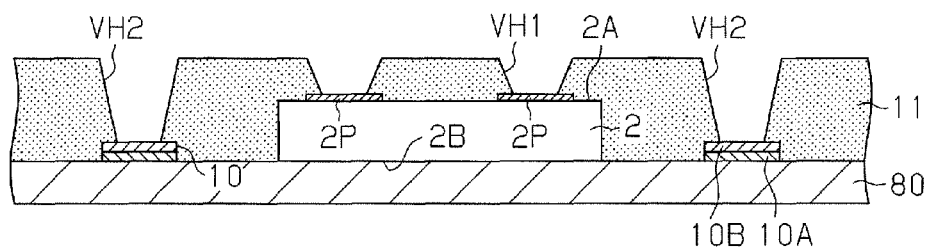

Next, in a process illustrated in FIG. 4A, the via holes VH1 are formed at specified locations of the first insulating layer 11 so that the top surface of each electrode pad 2P formed on the first surface 2A of the semiconductor chip 2 is exposed. Also, the via holes VH2 are formed at specified locations of the first insulating layer 11 so that a top surface of the second conductive layer 10B of the first wiring layer 10 is exposed. It is possible to form these via holes VH1, VH2 by a laser machining technique using a $CO_2$ laser, a YAG laser or an excimer laser, for example. If the first insulating layer 11 is made of photosensitive resin, the via holes VH1, VH2 may be formed at the specified locations by a photolithographic technique, for example.

If the via holes VH1, VH2 have been formed by using the laser machining technique, resin residues (resin smears) left in the via holes VH1, VH2 are removed by a desmearing process. It is possible to execute this desmearing process by using a permanganate method, for example.

Figure 4B:
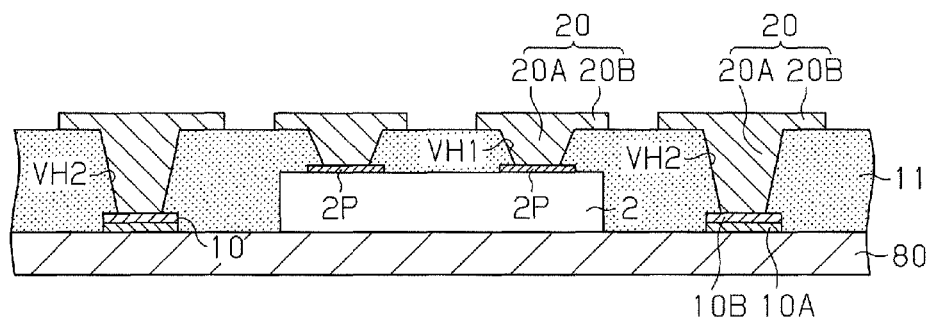
Figure 4C:
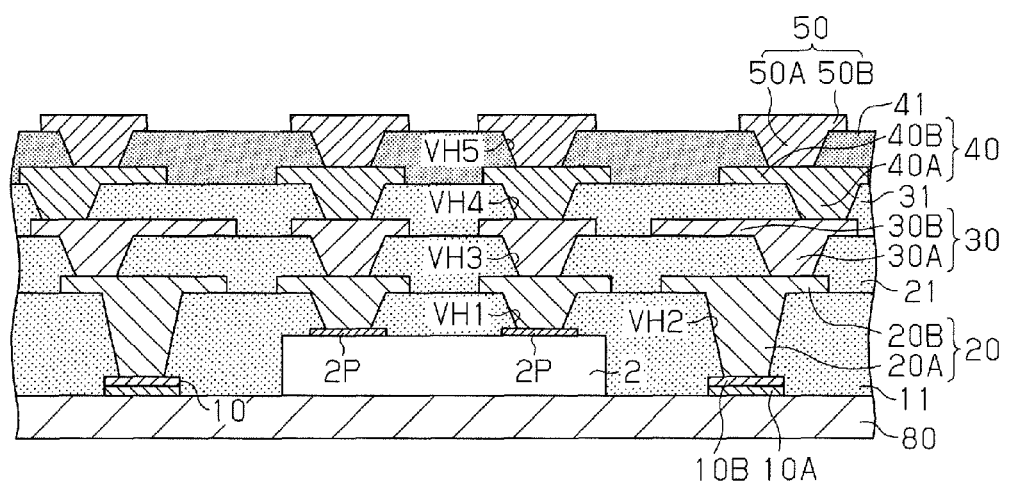

In a succeeding process illustrated in FIG. 4B, the via wirings 20A are formed by filling the via holes VH1, VH2 of the first insulating layer 11 with a via conductor, and the wiring pattern 20B electrically connected to the first wiring layer 10 through the via wirings 20A is formed on the first insulating layer 11. The via wirings 20A and the wiring pattern 20B which together constitute the second wiring layer 20 may be formed by one of various wiring processes, such as a semiadditive process or a subtractive process.

Then, insulating layers and wiring layers are alternately deposited by repetitively performing the processes illustrated in FIGS. 3E to 4B. For example, the second insulating layer 21 is formed on top of the first insulating layer 11 and the second wiring layer 20, and the via holes VH3 which reach a top surface of the wiring pattern 20B are formed in the second insulating layer 21. Subsequently, the via wirings 30A are formed in the via holes VH3, and the wiring pattern 30B which is electrically connected to the via wirings 30A is formed. Next, the third insulating layer 31 is formed on top of the second insulating layer 21 and the third wiring layer 30 and the via holes VH4 are formed in the third insulating layer 31. The via wirings 40A are then formed in the via holes VH4, and the wiring pattern 40B which is connected to the via wirings 40A is formed. Subsequently, the fourth insulating layer 41 is formed on top of the third insulating layer 31 and the fourth wiring layer 40 and the via holes VH5 are formed in the fourth insulating layer 41, and afterward, the via wirings 50A are formed in the via holes VH5 and the wiring pattern 50B which is connected to the via wirings 50A is formed.

Figure 5A:
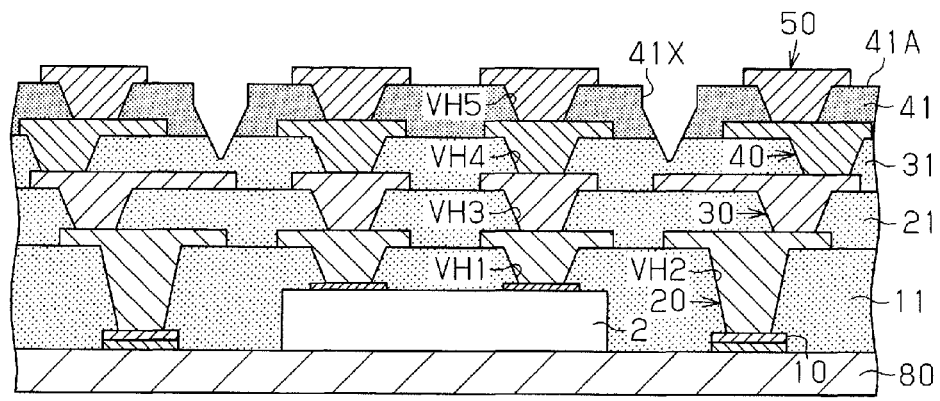

Next, in a process illustrated in FIG. 5A, the grooves 41X are formed in the third insulating layer 31 and the fourth insulating layer 41 from the side of the surface 41A (top surface as illustrated) of the fourth insulating layer 41. It is possible to form these grooves 41X by the laser machining technique using a $CO_2$ laser, a YAG laser or an excimer laser, or by a plasma etching (dry etching) technique or a blast treatment, for example. Formation of the grooves 41X results in a release of internal stresses. Since the semiconductor chip 2 and the wiring structure are fixedly mounted on the supporting substrate 80 which has a large thickness and is located on an opposite side of the surface in which the grooves 41X are formed, it is possible to reduce warpage which may potentially occur as a result of releasing of the internal stresses.

Figure 5B:
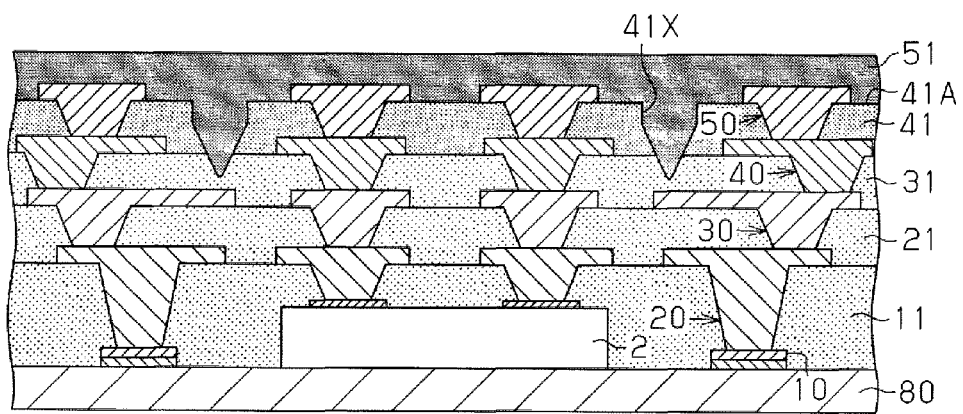

In a succeeding process illustrated in FIG. 5B, the grooves 41X are filled up and the buried resin layer 51 is formed on the surface 41A of the fourth insulating layer 41 to cover the fifth wiring layer 50. The buried resin layer 51 may be formed by laminating a photosensitive resist film on or by applying liquid resist to the surface 41A, for example.

Figure 6A:
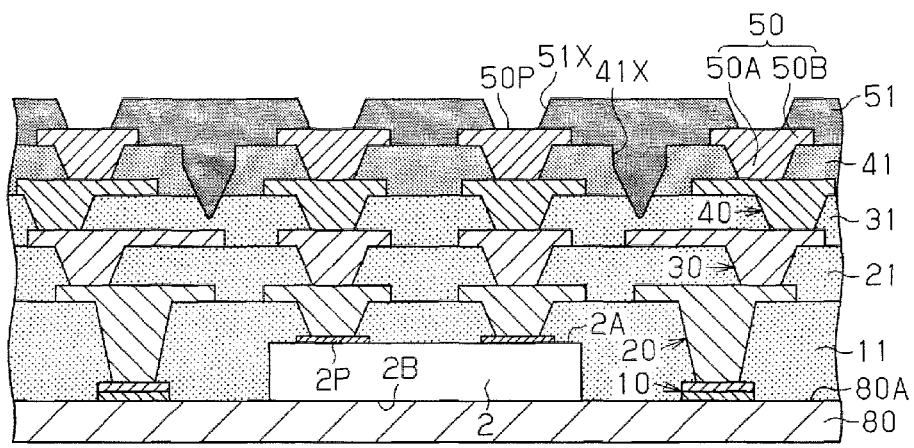

Subsequently, in a process illustrated in FIG. 6A, the openings 51X are formed at specified locations of the buried resin layer 51 so that a top surface of the wiring pattern 50B of the fifth wiring layer 50 is exposed. It is possible to form these openings 51X by the laser machining technique using a $CO_2$ laser, a YAG laser or an excimer laser, for example. If the buried resin layer 51 is made of photosensitive resin, the openings 51X may be formed at the specified locations by the photolithographic technique, for example. Consequently, part of the fifth wiring layer 50 is exposed through the openings 51X in the buried resin layer 51, forming the external connection pads 50P. If necessary, a metallic film may be formed on each of the external connection pads 50P by depositing an Ni layer and an Au layer in this order, for example. It is possible to form the metallic film by an electroless plating method, for example.

Figure 6B:
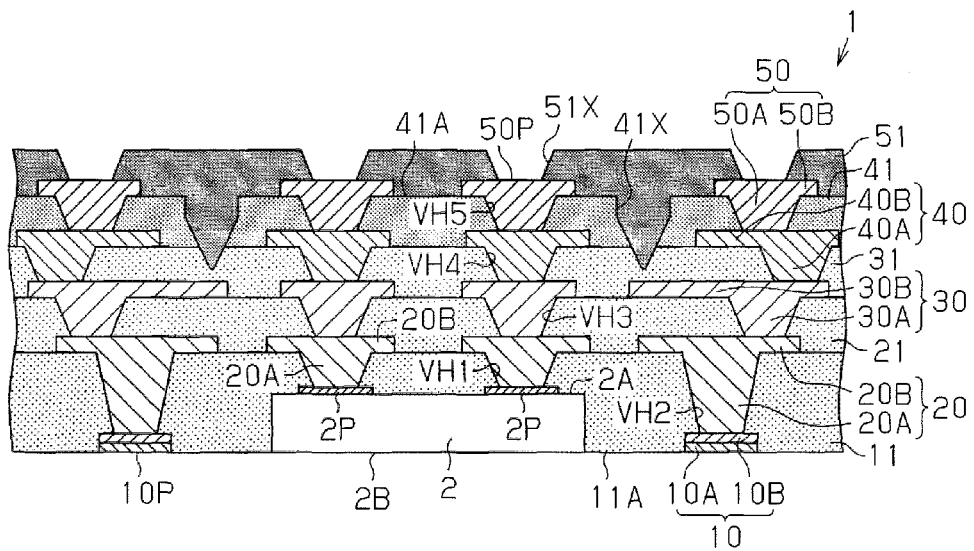

In a succeeding process illustrated in FIG. 6B, the supporting substrate 80 (refer to FIG. 6A) which has been used as a temporary substrate is removed. If a copper foil has been used as the supporting substrate 80, the supporting substrate 80 may be removed by wet etching using an aqueous solution of ferric chloride, copper chloride or ammonium persulfate, for example. Since the semiconductor chip 2 exposed from the first insulating layer 11 is made of silicon and an outermost layer of the first wiring layer 10 is made of an Au film, for instance, it is possible to selectively etch only the supporting substrate 80 made of the copper foil. It is to be pointed out, however, that if the fifth wiring layer 50 is a copper layer, it is necessary to etch the supporting substrate 80 after masking the fifth wiring layer 50 in order to avoid such a situation that the fifth wiring layer 50 exposed at the bottom of each opening 51X is etched together with the supporting substrate 80.

At this point in time, the grooves 41X are formed in the third insulating layer 31 and the fourth insulating layer 41 and are filled with the buried resin layer 51 having a thermal expansion coefficient close to that of the semiconductor chip 2. Thus, the third insulating layer 31 and the fourth insulating layer 41 are each divided into a plurality of segments and the thermal expansion coefficient of the buried resin layer 51 has a value close to the thermal expansion coefficient of the semiconductor chip 2 side. This arrangement makes it possible to reduce warpage of the semiconductor package 1 which can occur as a result of releasing of the stresses when the supporting substrate 80 is removed. Therefore, the semiconductor package 1 is kept in a flat shape.

The semiconductor package 1 of the embodiment may be manufactured by a manufacturing procedure described above.

A method of manufacturing a semiconductor device is now described hereinbelow.

Figure 7A:
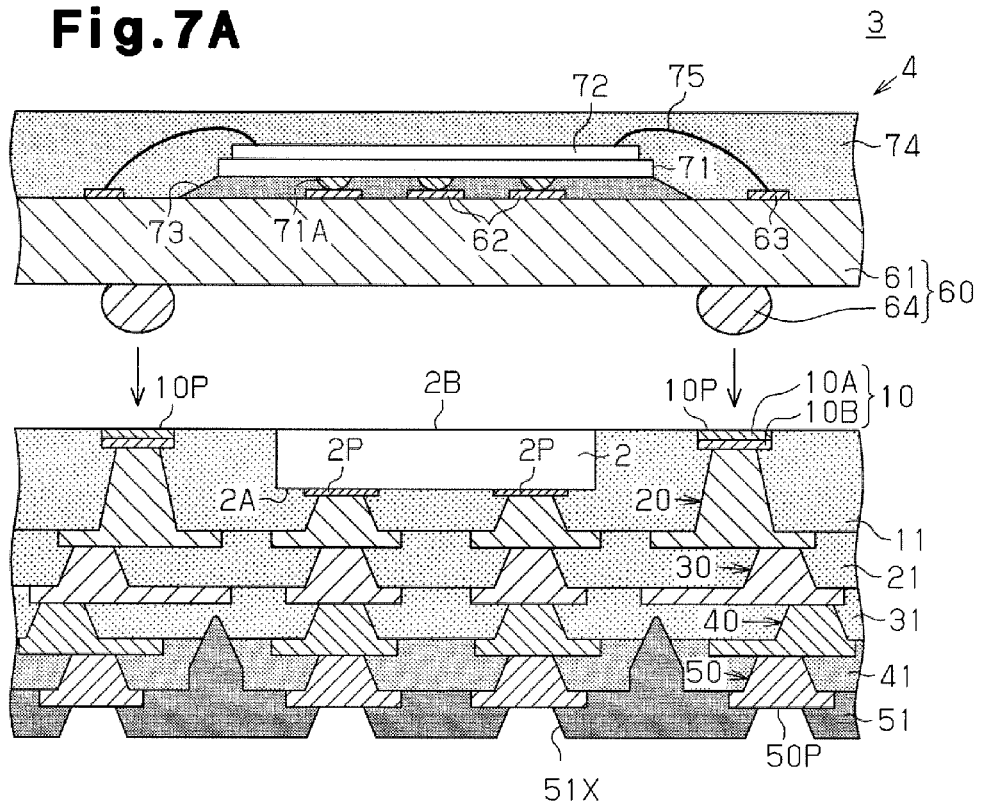
FIGS. 7A and 7B are schematic cross-sectional diagrams depicting a method of manufacturing a semiconductor device according to an embodiment.

As illustrated in FIG. 7A, the semiconductor package 4 is prepared in the beginning. Although not illustrated nor described in detail herein, the semiconductor package 4 may be manufactured by the below-described method. For example, the printed wiring board 60 having a plurality of chip mounting pads 62, bonding pads 63 and external connection terminals 64 is formed and the bumps 71A of the first semiconductor chip 71 are flip-chip-bonded to the respective chip mounting pads 62 formed on the top surface of the printed wiring board 60. Subsequently, the underfill resin layer 73 is formed between the printed wiring board 60 and the first semiconductor chip 71 and, then, the second semiconductor chip 72 is attached onto the first semiconductor chip 71 by an adhesive. Next, electrode pads (not illustrated) formed on the top surface of the second semiconductor chip 72 are wire bonded and connected to the respective bonding pads 63 formed on the top surface of the printed wiring board 60 by bonding wire 75 and, then, the first and second semiconductor chip 71, 72, the bonding wires 75, etc. are sealed by the sealing resin layer 74.

Then, the semiconductor packages 1 and 4 are aligned in such a manner that the plurality of external connection terminals 64 of the semiconductor package 4 face the respective connecting pads 10P of first wiring layer 10. At this point in time, a patterned layer of flux (not illustrated) is already transferred onto the individual external connection terminals 64 of the semiconductor package 4.

Figure 7B:
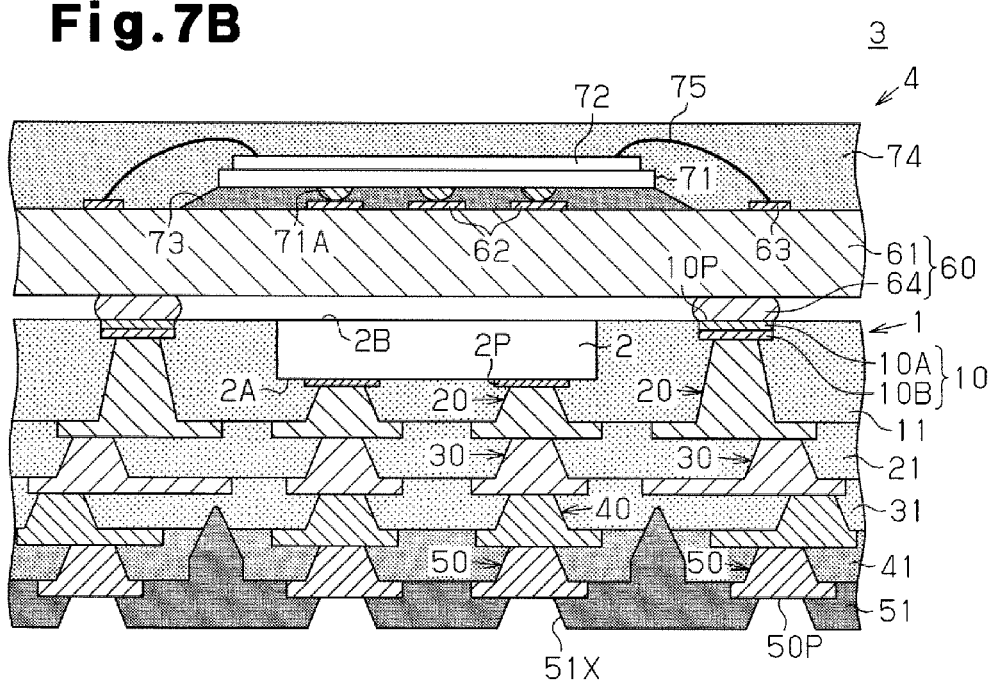

In a succeeding process illustrated in FIG. 7B, a workpiece structured as described above including the semiconductor package 4 aligned and mounted on the semiconductor package 1 is conveyed into a reflow furnace (not illustrated). Inside the reflow furnace, the individual external connection terminals 64 (which are solder balls at this point) are caused to reflow, and the semiconductor packages 1 and 4 are interconnected at the individual connecting pads 10P, whereby the semiconductor device 3 having a POP structure is obtained.

Since the semiconductor package 1 is held in a flat shape, it is possible to easily stack the semiconductor package 4 on top of the semiconductor package 1.

The foregoing embodiment provides the below-described advantages.

(1) In the fourth insulating layer 41 which is the outermost interlayer insulating layer and the third insulating layer 31 formed in the inner layer of the fourth insulating layer 41, there are formed the grooves 41X passing through the fourth insulating layer 41 in the thickness direction thereof. This makes it possible to alleviate stresses produced by contraction of the third insulating layer 31 and the fourth insulating layer 41 and thereby reduce warpage which may occur in the semiconductor package 1. As a result, the semiconductor package 1 may be held in a flat shape.

(2) The thermal expansion coefficient of the buried resin layer 51 which is formed on the opposite side of the semiconductor chip 2 and fills the grooves 41X is made closer to the thermal expansion coefficient of the semiconductor chip 2 than to those of the first to third insulating layers 11, 21, 31. This makes it possible to make the amount of contraction occurring on the buried resin layer 51 side during the cooling process performed after the heat treatment, for example, close to the amount of contraction occurring on the semiconductor chip 2 side and thereby reduce warpage which may occur in the semiconductor package 1.

(3) The thermal expansion coefficient of the fourth insulating layer 41 which is the outermost interlayer insulating layer is made closer to the thermal expansion coefficient of the semiconductor chip 2 than to those of the first to third insulating layers 11, 21, 31. This makes it possible to make the amount of contraction occurring on the buried resin layer 51 side during the cooling process performed after the heat treatment, for example, close to the amount of contraction occurring on the semiconductor chip 2 side and thereby reduce warpage which may occur in the semiconductor package 1.

(4) Incidentally, when the supporting substrate 80 is removed in the process illustrated in FIG. 6B, warpage may occur in the semiconductor package 1 due to a difference between the thermal expansion coefficient of the buried resin layer 51 side and the thermal expansion coefficient of the semiconductor chip 2 side. Should this situation occur, the buried resin layer 51 side tends to warp, forming a concave outer surface, because the thermal expansion coefficient of the buried resin layer 51 side is larger than that of the semiconductor chip 2 side.

Taking this situation into consideration, the semiconductor package 1 of the foregoing embodiment is configured such that the outermost fourth insulating layer 41 located on the side in which warpage is likely to occur is made as an insulating layer containing a reinforcement material. This makes it possible to increase rigidity of the fourth insulating layer 41, thereby preventing warpage of the semiconductor package 1 in an effective fashion. To be more specific, an increase in the rigidity of the fourth insulating layer 41 formed on the buried resin layer 51 side which may warp, forming a concave outer surface, if the semiconductor package 1 warps when the supporting substrate 80 is removed allows the fourth insulating layer 41 to effectively counteract stresses which cause the semiconductor package 1 to warp. This serves to produce an increased effect of reducing warpage of the semiconductor package 1.

(5) The grooves 41X are formed to be located in the area of the fourth insulating layer 41 outside the area where the semiconductor chip 2 is mounted. In the embodiment, the amount of warpage of the semiconductor package 1 tends to increase from a central portion of the semiconductor package 1 toward a peripheral portion thereof. Thus, the grooves 41X make it possible to effectively reduce warpage of the semiconductor package 1.

(6) The grooves 41X are formed under conditions where the supporting substrate 80 exists. This makes it possible to reduce warpage which may potentially occur as a result of releasing of the internal stresses when forming the grooves 41X.

(7) The grooves 41X are formed in an easy-to-produce grid pattern in top view. This makes it possible to easily form the grooves 41X.

(8) The grooves 41X are shaped to have a generally wedge-shaped cross section. This makes it possible to divide each of the third insulating layer 31 and the fourth insulating layer 41 into a plurality of segments. Therefore, it is possible to effectively alleviate the stresses produced by contraction of the third insulating layer 31 and the fourth insulating layer 41 and thereby reduce warpage which may occur in the semiconductor package 1.

The foregoing embodiment may be modified in various ways as described below.

Figure 8:
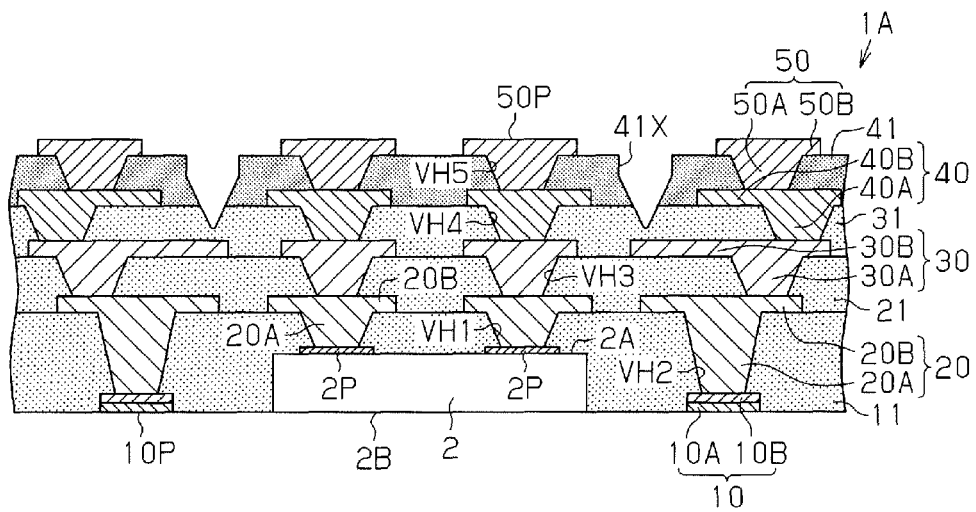
FIG. 8 is a schematic cross-sectional diagram depicting a semiconductor package in one modified embodiment.
Figure 9:
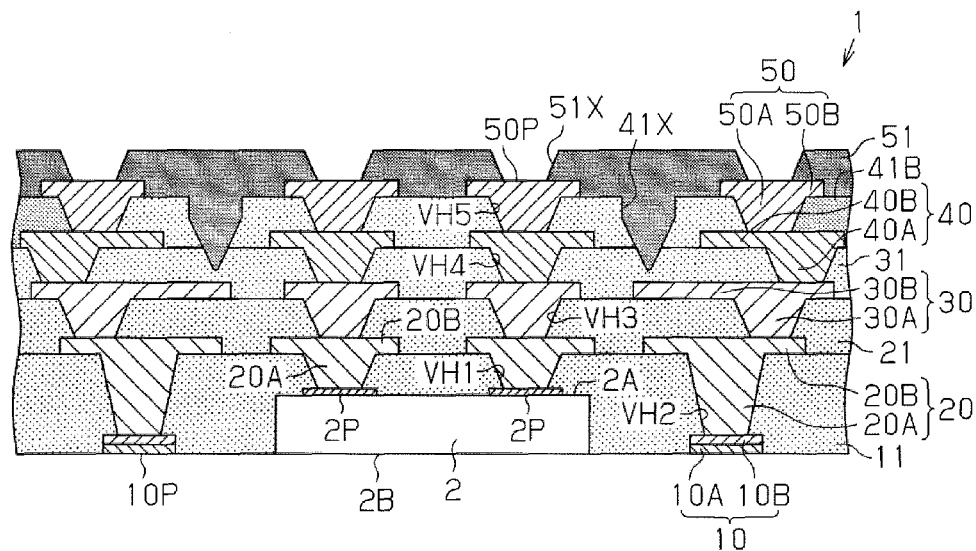
FIG. 9 is a schematic cross-sectional diagram depicting a semiconductor package in another modified embodiment.

The embodiment may be so modified as to eliminate the buried resin layer 51 as illustrated in FIG. 8. This modified structure having no buried resin layer 51 still have the same advantages as described above in (1) and (3) to (8).

The embodiment may be so modified as to replace the fourth insulating layer 41 with a fourth insulating layer 41B which is made of an insulating resin having the same composition as the first to third insulating layers 11, 21, 31.

Figure 10A:
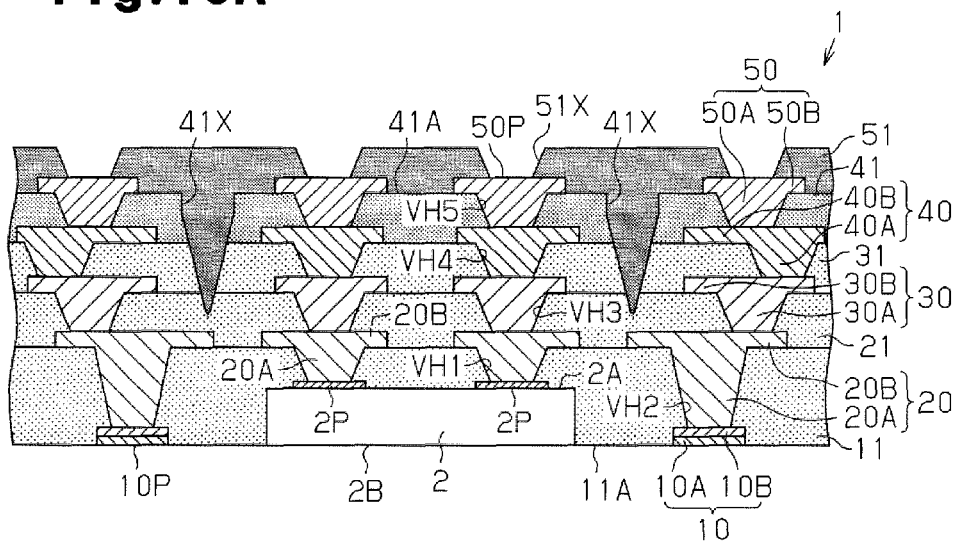
FIGS. 10A and 10B are schematic cross-sectional diagrams depicting semiconductor packages in other modified embodiment.

The grooves 41X of the foregoing embodiment are not limited to a particular shape (in cross-sectional view and plan view). Although the grooves 41X are formed in two interlayer insulating layers including the third insulating layer 31 and the fourth insulating layer 41 in the foregoing embodiment, the grooves 41X may be formed in three or more interlayer insulating layers as illustrated in FIG. 10A, for example. In a modified structure of FIG. 10A, the grooves 41X are formed to pass through the fourth insulating layer 41 and the third insulating layer 31 in the thickness direction thereof from the surface 41A of the fourth insulating layer 41 and penetrate the second insulating layer 21 down to a depth halfway into the thickness thereof. If the grooves 41X are formed so deep in this fashion, the number of interlayer insulating layers divided by the grooves 41X increases, so that this kind of modified embodiment can effectively reduce warpage of the semiconductor package 1.

Figure 10B:
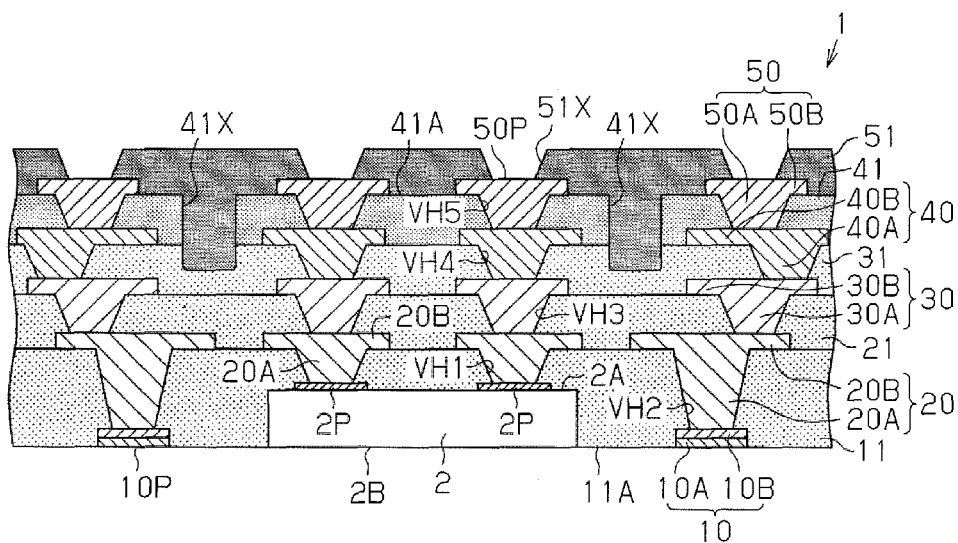

While the grooves 41X are shaped to have a generally wedge-shaped cross section in the foregoing embodiment, the grooves 41X may be shaped to have a rectangular cross section as illustrated in FIG. 10B, for example. Alternatively, the grooves 41X may be shaped to have a trapezoidal, U-shaped or semicircular cross section.

Figure 11A:
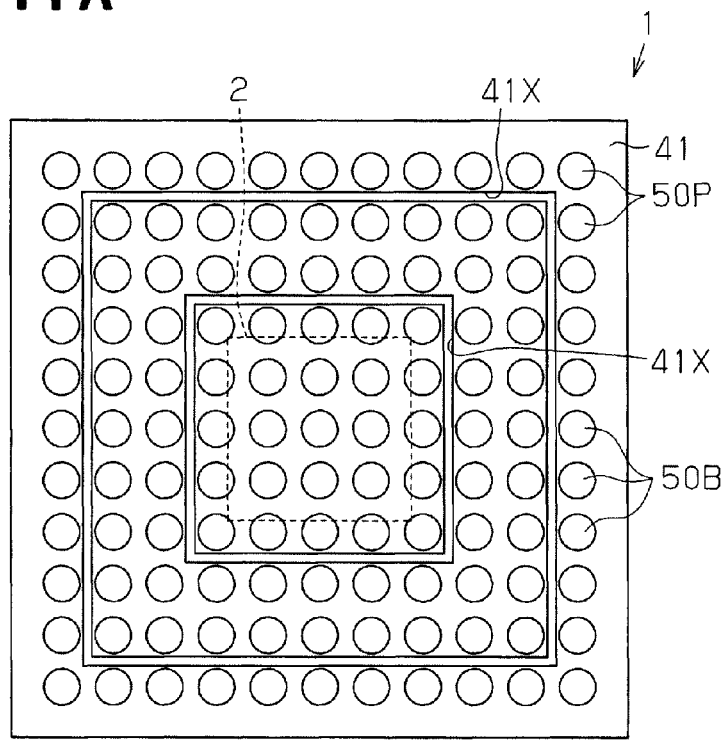
FIGS. 11A and 11B are schematic plan views of semiconductor packages in other modified embodiment, in which buried resin layers are not illustrated for the sake of simplicity of illustration.

Although the grooves 41X are arranged in a grid pattern in the foregoing embodiment, the invention is not limited to this arrangement. For example, the grooves 41X may be formed to be arranged in a generally frame-shaped pattern in plan view as illustrated in FIG. 11A, for example. While a pair of grooves 41X having a frame-shaped pattern is formed in a modified embodiment illustrated in FIG. 11A, there may be formed only one groove 41X or three or more grooves 41X.

Figure 11B:
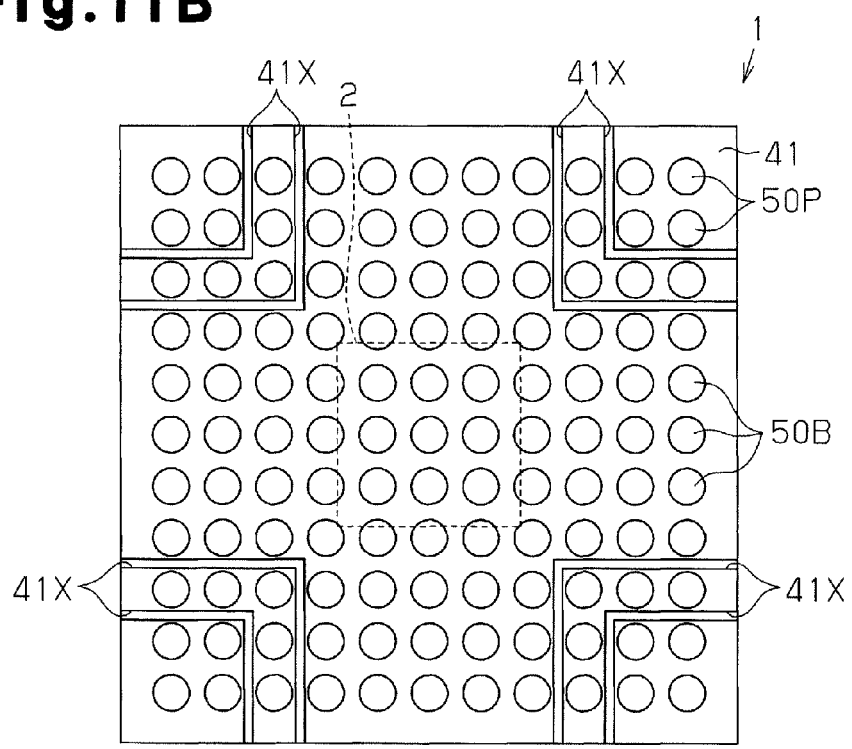

Alternatively, the grooves 41X may be formed to have a generally L-shaped pattern in plan view as illustrated in FIG. 11B, for example. In a modified embodiment illustrated in FIG. 11B, the grooves 41X are formed to have a generally L-shaped pattern located at each of four corners of the semiconductor package 1. While two each grooves 41X are formed at each corner of the semiconductor package 1 in the modified embodiment illustrated in FIG. 11B, there may be formed only one or three or more grooves 41X at each corner of the semiconductor package 1.

Although the grooves 41X are formed to be located in the area of the fourth insulating layer 41 outside the area where the semiconductor chip 2 is mounted in the foregoing embodiment, the invention is not limited to this arrangement. For example, additional grooves 41X may be formed in the area of the fourth insulating layer 41 where the semiconductor chip 2 is mounted.

Figure 12:
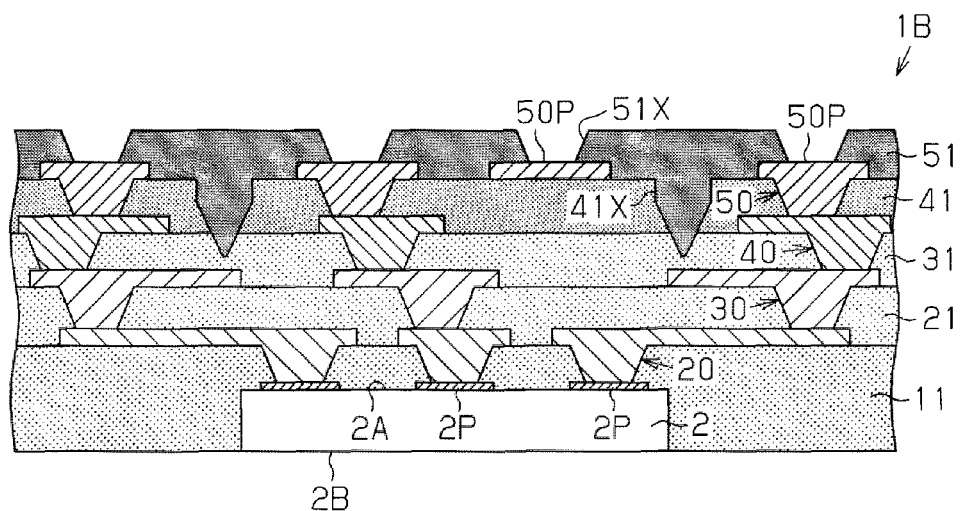
FIG. 12 is a schematic cross-sectional diagram depicting a semiconductor package in still another modified embodiment.

The first wiring layer 10 (connecting pads 10P) of the foregoing embodiment may be eliminated as illustrated in FIG. 12. The via holes VH2 which expose the top surface of the first wiring layer 10 and the via wirings 20A formed in the individual via holes VH2 in the foregoing embodiment are not provided in a semiconductor package 1B of this modified embodiment.

While the foregoing embodiment has presented an example in which the single semiconductor package 1 is produced on the supporting substrate 80, the embodiment may be so modified as to employ a procedure of manufacturing a plurality of semiconductor packages 1 at one time by producing a parent semiconductor member on the supporting substrate 80 and segmenting (singulating) the parent semiconductor member into the individual semiconductor packages 1.

In the above-described procedure of manufacturing the semiconductor package 1 of the embodiment, the semiconductor chip 2 is fixedly mounted on one side of the supporting substrate 80, wiring layers and insulating layers are laminated on the same one side of the supporting substrate 80 chiefly using the buildup method, and the supporting substrate 80 is finally removed to produce the semiconductor package 1. The invention, however, is not limited to this approach. For example, it is possible to employ a procedure in which semiconductor chips 2 are fixedly mounted on both sides of the supporting substrate 80, wiring layers and insulating layers are laminated on both sides of the supporting substrate 80 chiefly using the buildup method, and the supporting substrate 80 is finally removed to produce a plurality of semiconductor packages 1 at one time.

The number of layers and wiring layout of the semiconductor package 1 described in the foregoing embodiment may be modified or altered in various ways.

Also, the number of semiconductor chips mounted on the printed wiring board 60 of the semiconductor package 4 of the embodiment and the mounting method of these semiconductor chips may be modified or altered in various ways (e.g., the flip-chip mounting method, wire bonding method, or a combination thereof).

EXAMPLES

The foregoing embodiment and modifications thereof are described more particularly with reference to specific examples and comparative examples.

The following discussion presents estimates of the amount of semiconductor package warpage based on a result of simulation performed on each of semiconductor packages provided with the grooves 41X (Examples 1 and 2) and semiconductor packages unprovided with the grooves 41X (Comparative Examples 1 and 2).

Example 1

The semiconductor package of Example 1 is the same as the semiconductor package 1 illustrated in FIG. 1A. The dimensions of the semiconductor package 1 have been input as conditions for the simulation. The semiconductor package 1 has a square shape measuring 12 mm×12 mm in plan view. The semiconductor chip 2 has a square shape measuring 9 mm×9 mm in plan view and a thickness of 100 µm. The entire semiconductor package 1 has a thickness of 550 µm. The second to fifth wiring layers 20, 30, 40, 50 each have a thickness of 15 µm. The first insulating layer 11 has a thickness of 180 µm. The second and third insulating layers 21, 31 each have a thickness of 30 µm. The fourth insulating layer 41 has a thickness of 100 µm. The buried resin layer 51 has a thickness of 50 µm. The grooves 41X were formed by laser machining using a $CO_2$ laser. The grooves 41X have a depth of 120 µm.

Example 2

The semiconductor package of Example 2 is the same as the semiconductor package 1A illustrated in FIG. 8, which is essentially the semiconductor package of Example 1 from which the buried resin layer 51 has been removed. Compared to the conditions input for Example 1, conditions for the simulation input for Example 2 differ only in that warpage is measured under conditions where the semiconductor package 1A is fixedly mounted on the supporting substrate 80 which is 200 µm thick.

Comparative Example 1

Figure 13:
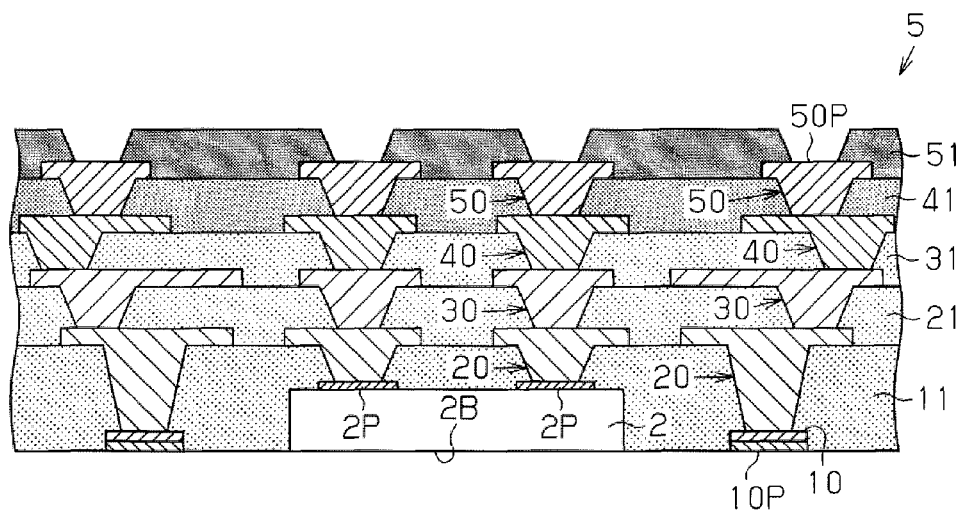
FIG. 13 is a schematic cross-sectional diagram depicting a semiconductor package of comparative example 1.

The semiconductor package of Comparative Example 1 is a semiconductor package 5 illustrated in FIG. 13. This semiconductor package 5 has the same structure as the semiconductor package 1 of Example 1 except that the grooves 41X (refer to FIG. 1A) are not formed. The semiconductor package 5 was evaluated using the same conditions for the simulation as used for Example 1.

Comparative Example 2

Figure 14:
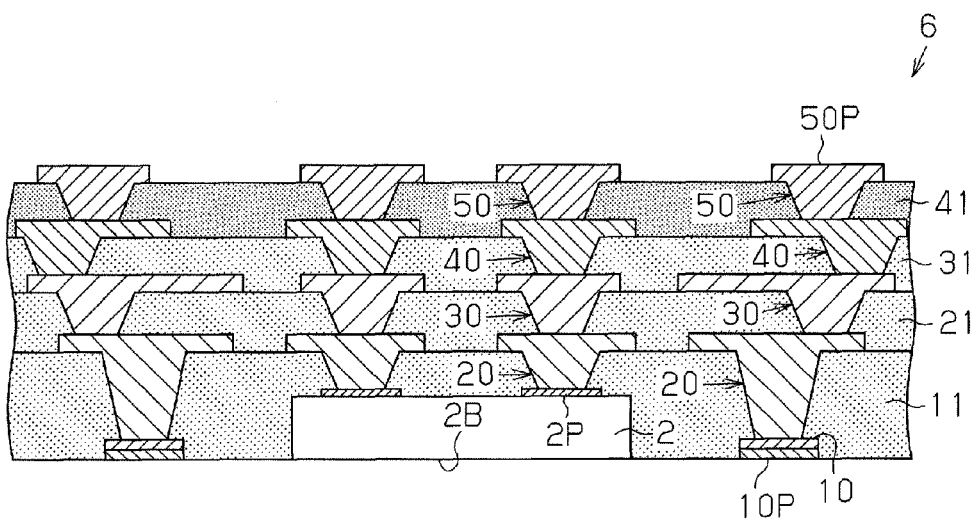
FIG. 14 is a schematic cross-sectional diagram depicting a semiconductor package of comparative example 2.

The semiconductor package of Comparative Example 2 is a semiconductor package 6 illustrated in FIG. 14. This semiconductor package 6 has the same structure as the semiconductor package 1A of Example 2 except that the grooves 41X (refer to FIG. 8) are not formed. The semiconductor package 6 was evaluated using the same conditions for the simulation as used for Example 2.

Measuring Method

After placing each semiconductor package in a 190° C. environment to release internal stresses thereof, package warpage which occurred when the temperature was lowered to 25° C. was measured. The height of a surface of each semiconductor package opposite the chip mounting surface 11A where the semiconductor chip 2 was mounted was measured along a diagonal of the package and a difference between a highest point and a lowest point was determined. Table 1 below indicates the result of the simulation, in which the amount of warpage is denoted by a plus sign if the surface of the package opposite the chip mounting surface 11A warped in a convex form, a minus sign if the surface of the package opposite the chip mounting surface 11A warped in a concave form.

TABLE 1

|  | Grooves | Embedded resin layer | Amount of warpage (µm) |
| --- | --- | --- | --- |
| Example 1 | Provided | Provided | −105 |
| Comparative Example 1 | Unprovided | Provided | −125 |
| Example 2 | Provided | Unprovided | −10 |
| Comparative Example 2 | Unprovided | Unprovided | −23 |

A comparison of Examples 1 and 2 against Comparative Examples 1 and 2 indicates that the amount of warpage is significantly reduced in the semiconductor packages of Examples 1 and 2 provided with the grooves 41X compared to the semiconductor packages of Comparative Examples 1 and 2 unprovided with the grooves 41X.

All examples and conditional language recited herein are intended for pedagogical purposes to aid the reader in understanding the principles of the invention and the concepts contributed by the inventor to further the art, and are to be construed as being without limitation to such specifically recited examples and conditions, nor does the organization of such examples in the specification relate to a illustrating of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor package comprising:
a semiconductor chip;
a first insulating layer formed to cover the semiconductor chip;
a wiring structure formed on the first insulating layer, and having an alternately layered configuration including wiring layers electrically connected to the semiconductor chip and interlayer insulating layers each located between one of the wiring layers and another; and the interlayer insulating layers including an outermost interlayer insulating layer located farthest from a surface of the first insulating layer;
a groove formed in the outermost interlayer insulating layer and passing through the outermost interlayer insulating layer in a thickness direction; and
a buried resin layer formed on the outermost interlayer insulating layer to fill the groove, the buried resin layer having a thermal expansion coefficient closer to that of the semiconductor chip than to that of the interlayer insulating layers.

2. The semiconductor package according to claim 1, wherein the groove includes a deepest part which is located in one of the interlayer insulating layers halfway along the thickness direction, the one of the interlayer insulating layers being formed in a layer beneath the outermost interlayer insulating layer.

3. The semiconductor package according to claim 1, wherein the groove passes through one of the interlayer insulating layers formed in a layer beneath the outermost interlayer insulating layer in the thickness direction.

4. The semiconductor package according to claim 1, wherein the outermost interlayer insulating layer includes an inside area corresponding to an area where the semiconductor chip is mounted in plan view and an outside area located outside the inside area in plan view, and the groove is formed in the outside area of the outermost interlayer insulating layer.

5. The semiconductor package according to claim 4, wherein the wiring layers include an outermost wiring layer located farthest from the surface of the first insulating layer and external connection pads included in the outermost wiring layer, and wherein the groove of the outermost interlayer insulating layer is arranged between the external connection pads.

6. The semiconductor package according to claim 1, wherein the groove has a wedge-shaped cross section.

7. The semiconductor package according to claim 1, wherein the outermost interlayer insulating layer is made of a resin material containing a reinforcement material and has a thermal expansion coefficient closer to that of the semiconductor chip than to that of the other interlayer insulating layers.

8. The semiconductor package according to claim 1 further comprising a pad formed on the same plane as the semiconductor chip to establish a connection to another semiconductor package.

9. A semiconductor device comprising:
a first semiconductor package, including;
    a semiconductor chip,
    a first insulating layer formed to cover the semiconductor chip,
    a wiring structure formed on the first insulating layer, and having an alternately layered configuration including wiring layers electrically connected to the semiconductor chip and interlayer insulating layers each located between one of the wiring layer sand another; and the interlayer insulating layers including an outermost interlaying insulating layer located farthest from a surface of the first insulating layer,
    a groove formed in the outermost interlayer insulating layer and passing through the outermost interlayer insulating layer in a thickness direction, and
    a pad formed on the dame plan as the semiconductor chip; and
a second semiconductor package mounted on the first semiconductor package and electrically connected to the pad of the first semiconductor package.

* * * * *